United States Patent
Nickel et al.

(10) Patent No.: US 8,202,810 B2
(45) Date of Patent: Jun. 19, 2012

(54) LOW-H PLASMA TREATMENT WITH $N_2$ ANNEAL FOR ELECTRONIC MEMORY DEVICES

(75) Inventors: Alexander H. Nickel, Santa Clara, CA (US); Allen L. Evans, Dripping Springs, TX (US); Minh Quoc Tran, Milpitas, CA (US); Lu You, San Jose, CA (US); Minh Van Ngo, Fremont, CA (US); Pei-Yuan Gao, San Jose, CA (US); William S. Brennan, Austin, TX (US); Erik Wilson, Santa Clara, CA (US); Sung Jin Kim, Palo Alto, CA (US); Hieu Trung Pham, Santa Clara, CA (US)

(73) Assignee: Spansion LLC, Sunnyvale, CA (US)

(*) Notice: Subject to any disclaimer, the term of this patent is extended or adjusted under 35 U.S.C. 154(b) by 798 days.

(21) Appl. No.: 11/971,331

(22) Filed: Jan. 9, 2008

(65) Prior Publication Data
US 2009/0176369 A1 Jul. 9, 2009

(51) Int. Cl.
*H01L 21/31* (2006.01)
(52) U.S. Cl. ......... 438/792; 438/660; 438/672; 438/902
(58) Field of Classification Search .................. None
See application file for complete search history.

(56) References Cited

U.S. PATENT DOCUMENTS

| | | | |
|---|---|---|---|
| 6,190,966 B1* | 2/2001 | Ngo et al. ............... 438/257 |
| 6,483,172 B1* | 11/2002 | Cote et al. .............. 257/639 |
| 6,489,240 B1 | 12/2002 | Iacoponi et al. |
| 6,555,479 B1 | 4/2003 | Hause et al. |
| 6,656,840 B2* | 12/2003 | Rajagopalan et al. ....... 438/687 |
| 6,737,747 B2* | 5/2004 | Barth et al. .............. 257/760 |
| 6,767,827 B1 | 7/2004 | Okada et al. |
| 6,800,494 B1 | 10/2004 | Castle et al. |
| 6,897,144 B1* | 5/2005 | Ngo et al. ............... 438/627 |
| 2002/0142622 A1* | 10/2002 | Iijima et al. ............. 438/768 |
| 2003/0087513 A1* | 5/2003 | Noguchi et al. ........... 438/627 |
| 2005/0287823 A1* | 12/2005 | Ramachandran et al. .... 438/791 |
| 2007/0293046 A1* | 12/2007 | Kim ................... 438/692 |

OTHER PUBLICATIONS

Yota, J., Janani, M., Camilletti, L.E., Kar-Roy, A., Liu, Q. Z., Nguyen, C., Woo, M. D., Hander, J., and van Cleemput, P., 'Comparison between HDP CVD and PECVD silicon nitride for advanced interconnect applications,' Proceedings of the IEEE 2000 International Interconnect Technology Conference, 2000, p. 76-78.*

Ma, Y., Yasuda, T., Lucovsky, G., 'Fixed and trapped charges at oxide-nitride-oxide heterostructure interfaces by remote plasma enhanced chemical vapor deposition,' J. Vac. Sci. Tech B, 11(4) 1993 p. 1533-1540.*

* cited by examiner

*Primary Examiner* — Charles Garber
*Assistant Examiner* — Bryan Junge
(74) *Attorney, Agent, or Firm* — Eschweiler & Associates, LLC

(57) ABSTRACT

A method for forming a single damascene and/or dual damascene, contact and interconnect structure, comprising: performing front end processing, depositing copper including a copper barrier, annealing the copper in at least 90% $N_2$ with less than 10% $H_2$, performing planarization, performing in-situ low-H $NH_3$ plasma treatment and low Si—H SiN etch stop layer deposition, and performing remaining back end processing.

9 Claims, 12 Drawing Sheets

LOW-H PLASMA TREATMENT WITH $N_2$ ANNEAL FOR ELECTRONIC MEMORY DEVICES

FIELD OF THE INVENTION

This invention relates generally to semiconductor processing, and more particularly to a method and process for fabricating flash memory with greater data retention reliability.

BACKGROUND OF THE INVENTION

Integrated circuits (ICs) are formed on semiconductor substrates using different processing techniques, known in the art, to produce transistors, interconnection elements, and the like. In order to electrically connect transistors on the semiconductor substrate, conductive vias, trenches and interconnects are formed in the dielectric materials as part of the integrated circuit. These vias, trenches and electrical interconnections combine electrical signals and power between transistors, internal circuits of the IC, and circuits external to the integrated circuit, for example.

The semiconductor industry is constantly working to improve the quality, reliability and throughput of integrated circuits based in part upon consumer demand for higher quality devices. Factors, such as feature critical dimensions, doping levels, contact resistance, particle contamination, etc., all may potentially affect the end performance of the electrical device. Copper is increasingly becoming the material of choice for forming conductive interconnections on integrated circuit devices. This is due, in large part, to the superior electrical characteristics of copper as compared to other materials, e.g., aluminum, previously used to form such interconnections. Copper is not readily etched by chemical processes and thus fabrication processes such as single damascene and dual damascene, have been utilized to create copper conductive interconnections. In general, such methods involve forming a patterned layer of insulating material having multiple openings, such as trench interconnect lines or interconnect vias, formed therein, forming a barrier metal layer above the patterned insulating layer and in the openings, forming a copper seed layer above the barrier metal layer, performing an electroplating process to deposit a bulk copper layer above the copper seed layer and, thereafter, performing one or more chemical mechanical polishing processes to remove the excess copper and barrier material from above the patterned insulating layer.

Damascene interconnection processes for semiconductor devices are replacing conventional deposition and etch processes. Traditionally, metal films have been deposited and patterned using photolithography to pattern metal interconnects within a semiconductor substrate. As conductive lines are patterned closer and closer together and as interconnections shrink, it becomes more and more difficult to accurately pattern the conductive lines and form the conductive interconnects using the conventional layered deposition and patterning processes that do not suffer in some way from electrical or mechanical problems. Often, solving one problem can result in creating yet another, different problem.

For example, etch stop layering techniques are well known by those of ordinary skill in the art. In one process a special plasma treatment is carried out before the etch stop layer (e.g., silicon nitride) deposition since copper is not self passivating as is aluminum to form an oxide (e.g., aluminum oxide, and the like) that if not cleaned off can result in poor adhesion between the copper and the etch stop layer silicon nitride, for example. With weak adhesion, electrons can diffuse along copper and silicon nitride interface to significantly degrade electro-migration lifetime, for example.

An example of a damascene process is described in U.S. Pat. No. 6,800,494; wherein the process is depicted in prior art FIGS. 1-5. The following is a brief discussion of an illustrative prior art process flow for forming interconnections in an integrated circuit device. It is to be appreciated that numerous prior art methods exist for creating damascene structures and the following method illustrates but one such method and its associated problems. These problems are common place in many damascene techniques.

As shown in prior art FIG. 1, a transistor 22 is formed above a substrate 20 between isolation regions 26. The transistor 22 is comprised of source/drain regions 24. Also depicted in prior art FIG. 1 is a patterned layer of insulating material 25 having a plurality of conductive trenches or contacts 27 formed therein. As will be recognized by those skilled in the art, the conductive contacts 27 provide electrical contact to the source/drain regions 24 of the transistor 22. The materials used to form the components depicted in FIG. 1, as well as the methods of making such components, are generally well-known to those skilled in the art and will not be described herein in any greater detail. For example, the conductive contacts 27 may be comprised of a variety of materials, e.g., tungsten, and they may be formed by a variety of known techniques. The size, shape and number of the conductive contacts 27 may also vary. Although not depicted in the drawings, a barrier/glue layer of metal, e.g., titanium may be formed in the openings in the patterned layer of insulating material 25 prior to forming the conductive contacts 27.

Additionally, although the present invention is initially described in the context of forming conductive interconnections 36A (see prior art FIG. 5) that contact the conductive contacts 27, those skilled in the art, after reading the entirety of the present application, will understand that the methods of the present invention may be employed to form conductive interconnections at any level of an integrated circuit device using a variety of techniques, such as single or dual damascene integration techniques.

Initially, a patterned layer of insulating material 28, having a plurality of openings 30 formed therein, is formed above the layer of insulating material 25 and the conductive contacts 27. The patterned layer of insulating material 30 may be comprised of a high-K (K>5) material, a low-K (2.5<K<5.0) material, or an ultra low-K (K<2.5) material, and it may be formed by a variety of processing methods, e.g., atomic layer deposition (ALD), chemical vapor deposition (CVD), spin-on dielectric (SOD), etc. Alternatively, a multi-film composite stack could be used which would include combinations of the above films and could include an etch stop layer, a middle etch stop, a cap layer, a pore seal layer, etc. The openings 30 in the patterned layer of insulating material 28 may be formed by performing one or more etching processes in an etch tool (not shown). Thereafter, the substrate 20, with the patterned layer of insulation material 28 formed thereabove, is positioned in the vacuum isolated tool where a degas process, an etch/clean process, a barrier metal deposition process, and a copper seed deposition process are performed.

More specifically, the degas process is performed in a degas chamber, wherein the wafer 20 is heated under vacuum to a temperature range of approximately 150-450° C. for approximately 30-240 seconds. The purpose of the degas process is to remove, outgas or drive off a variety of residual materials that may be present on or in the patterned insulating material 28, such as water (as $H_2O$ or OH), CO, $CO_2$, $F_2$, hydrocarbons, etc. Then, the wafer 20 is vacuum-transferred to the etch/clean chamber, where any residual contamination, hydrocarbons, polymers or oxides covering any important contact regions are removed by sputter etching the wafer 20.

Once the wafer 20 has been cleaned in the etch/clean chamber, the wafer 20 is transferred under vacuum to the barrier metal deposition chamber, where a process is performed to deposit the barrier metal layer 32 shown in prior art FIG. 2. The barrier metal layer 32 is deposited above the patterned insulating layer 28 and in the openings 30 that were cleaned in the previous etch/clean chamber 14. The barrier metal layer 32 can be deposited by physical vapor deposition (PVD), chemical vapor deposition (CVD), atomic layer deposition (ALD) or other techniques known to those skilled in the art. This barrier metal layer 32 may be comprised of a variety of materials, e.g., tantalum, tantalum nitride, titanium, titanium nitride, titanium nitride silicon, titanium silicon nitride, tungsten, tungsten nitride, tungsten carbon nitride, etc., and it may have a thickness ranging from approximately 0.1-60 nm. The purpose of the barrier metal layer 32 is to, among other things, provide adhesion to the interlayer dielectric layers, provide wetting to the copper seed layer, and prevent migration of the copper material that forms the conductive interconnection 36A into unwanted areas of the integrated circuit device. Ideally, this barrier metal layer 32 will be as thin as possible, while still maintaining its ability to perform its intended function.

Next, the wafer 20 is sent, under vacuum, to the copper seed layer deposition chamber wherein the copper seed layer 34 is deposited above the barrier metal layer 32, as depicted in prior art FIG. 3. The process performed in the copper seed layer deposition chamber may be a PVD, CVD or ALD process, or any other technique known to those skilled in the art for forming such layers. The thickness of the copper seed layer 34 may range from approximately 20-200 nm. The copper seed layer 34 may be pure copper or it may be comprised of a copper alloy, such as copper tin, copper magnesium, copper chromium, copper calcium, etc. After the copper seed layer 34 is deposited, the wafer 20 may be removed from the barrier/seed tool and an electroplating process may be performed to form a bulk copper layer 36 above the wafer 20, as shown in prior art FIG. 4. The techniques and method used to form the bulk copper layer 36 using electroplating processes are well-known to those skilled in the art. After the bulk copper layer 36 is formed, an anneal process may be performed, and one or more chemical mechanical polishing operations may be performed to remove the excess portions of the bulk copper layer 36, the copper seed layer 34 (to the extent it is distinguishable from the bulk copper layer 36) and the barrier metal layer 32 from above the surface 29 of the patterned layer of insulating material 28 to thereby result in the definition of the copper interconnections 36A as shown in prior art FIG. 5.

FIGS. 6A and 6B illustrate yet another conventional prior art method 600 for fabricating a dual damascene structure as disclosed in U.S. Pat. No. 6,767,827. Referring initially to FIG. 6A, the method 600 comprises front end processing 630 which may include acts 602, 604, 606, 608, 610, 612, 614, 616, 618, 620, 624, 626 and 628. The method begins at 602 wherein a substrate has a dielectric layer having one or more conductive structures residing therein, such as copper interconnects. At 602 an etch stop layer is formed over the substrate. At 604 a photoresist can then be formed over the etch stop layer (ESL) at 604, for example, via a spin-coating process. The photoresist is also patterned at 604, for example, by selectively exposing the photoresist to radiation followed by development thereof according to photolithography techniques. The portion of the ESL exposed by the patterned photoresist is then patterned at 606 using the patterned photoresist as a mask. The ESL is patterned at 606 via a dry etch process that is substantially selective to the underlying substrate material which may be, for example, copper or tungsten. The patterned photoresist is then removed at 608.

The prior art method 600 of FIG. 6A continues at 610, wherein a first inter-layer dielectric (ILD) is formed over the patterned ESL. A mid-etch stop layer (MSL) at 612, is then formed on or over a first inter-layer dielectric (ILD) at 612. A second ILD can then be formed over the first MSL at 614, for example. As shown in FIG. 6A, two cap layers are formed over the patterned second ESL in succession at 616. A photoresist layer is then formed over the second cap layer at 618, and the top (or second) cap layer is patterned at 620 to have an opening therethrough that generally corresponds to the opening within the underlying ESL. The remaining photoresist is subsequently removed at 620 as well. In one example, the opening is larger than the ESL opening, wherein the ESL opening generally corresponds to a via opening size while the top cap layer opening generally corresponds to a trench opening size, as will be further appreciated by those of skill in the art.

At 622, another photoresist is formed and patterned over the first cap layer and used to form an opening in the lower second cap layer at 624 (the first cap layer), wherein the opening therein is smaller than the opening in the second cap layer. A second ILD is then patterned at 626 using the patterned photoresist (if not removed) and the opened first cap layer as a mask to define a via opening (generally corresponding to the opening in the ESL). The first cap layer and exposed MSL are patterned concurrently at 628, followed by concurrent patterning of the first and second ILD layers. The trench width is defined by the cap layers and the via width is defined by the opened MSL. At 628 the front end processing 630 (see bracketed processes in FIG. 6A) in the prior art approach is completed. It should be appreciated that the term "front end processing" is arbitrarily defined and could include additional processes or delete some of the acts shown. As mentioned supra, the process 630 described was a current method for front-end processing of a single or dual damascene device described in U.S. Pat. No. 6,767,827.

The prior art process 600 may then continue at 632 by the deposition of a conductive material, for example, copper. Now described is the current technology for backend-of-line processing (not related to U.S. Pat. No. 6,767,827 discussed supra) and some of the associated problems with the prior art approach that the invention overcomes. In the current generic single and dual damascene (inlaid) backend-of-line (BEOL) process flows, electrochemical copper plated (ECP) films are deposited, at 632 in FIG. 6B, within the oxide via and trench structures and over the full wafer surface. This is followed by a copper anneal involving $H_2$ and $N_2$ at 634, followed by a chemical mechanical polish (CMP) process 636 to define and isolate the copper wiring within the dielectric for a given product pattern layout. After the copper wiring is defined, a dielectric capping layer, diffusion barrier layer, and etch stop layer (ESL) is deposited at 638 followed by subsequent BEOL processing at 640 to complete the full process integration. This copper dielectric interface has been extensive studied and characterized in the literature. However, the following manufacturing issues have been observed, e.g., interface adhesion failures, delamination, Cu hillock defects, interlayer dielectric (ILD) nodules, metal sheet resistance variation, voltage ramped dielectric breakdown (VRDB) leakage, time dependent dielectric breakdown (TDDB) leakage, and pad peeling.

Therefore, a method and process for damascene processing is desired that allows for increased reliability of the memory devices. The present invention is directed to overcoming, or at least reducing the effects of, one or more of the problems set forth above.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its sole purpose is to present some concepts of the invention in a simplified form as a prelude to the more detailed description that is presented later.

However, as will be apparent to those skilled in the art, the present invention may be practiced without these specific details or by using alternate acts, elements or processes. In other instances well-known processes, procedures and components have not been described in detail so as not to unnecessarily obscure aspects of the present invention. The methods may be employed on recessed features such as vias or trenches in single or dual damascene devices.

The present invention according to one or more aspects of the invention pertains to a method for forming a single damascene and/or dual damascene, contact and interconnect structure, comprising: performing front end processing, depositing copper including a copper barrier, annealing the copper in at least 90% $N_2$ with less than 10% $H_2$, performing planarization, and forming low Si—H SiN etch stop layer deposition, and performing remaining back end processing.

The present invention according to yet another aspect pertains to a method for forming a single or dual damascene structure, comprising: performing front end processing thereby defining the single or dual damascene opening in a dielectric, depositing copper including a copper barrier, annealing the copper in 90% $N_2$ with less than 10% $H_2$, performing planarization of the copper, performing an in-situ low-H $NH_3$ plasma treatment, performing a low Si—H SiN etch stop layer deposition over the planarized copper, and performing remaining back end processing.

Another aspect of the present invention pertains to a communication device, comprising: a flash memory CPU, the flash memory operatively coupled to the CPU and configured to transfer data to and from the CPU, an input component for entering the data, a display component for displaying information, a plurality of switches, and wherein the flash memory is formed by the method, comprising: performing front end processing, depositing copper including its barrier, annealing the copper in at least 90% $N_2$ with less than 10% $H_2$, planarization of the copper, performing in-situ low-H $NH_3$ plasma treatment, depositing low Si—H SiN etch stop layer, and performing back end processing.

The present invention according to yet one or more aspects of the present invention pertains to a communication device, comprising: a flash memory CPU, the flash memory operatively coupled to the CPU and configured to transfer data to and from the CPU, an input component for entering the data, a display component for displaying information, a plurality of switches, flash memory, and wherein the flash memory is formed by the method, comprising: performing front end processing, depositing copper, including its barrier, annealing the copper in at least 90% $N_2$ and less than 10% $H_2$, performing planarization, performing a low Si—H SiN etch stop layer deposition over the planarized copper, and performing remaining back end processing.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
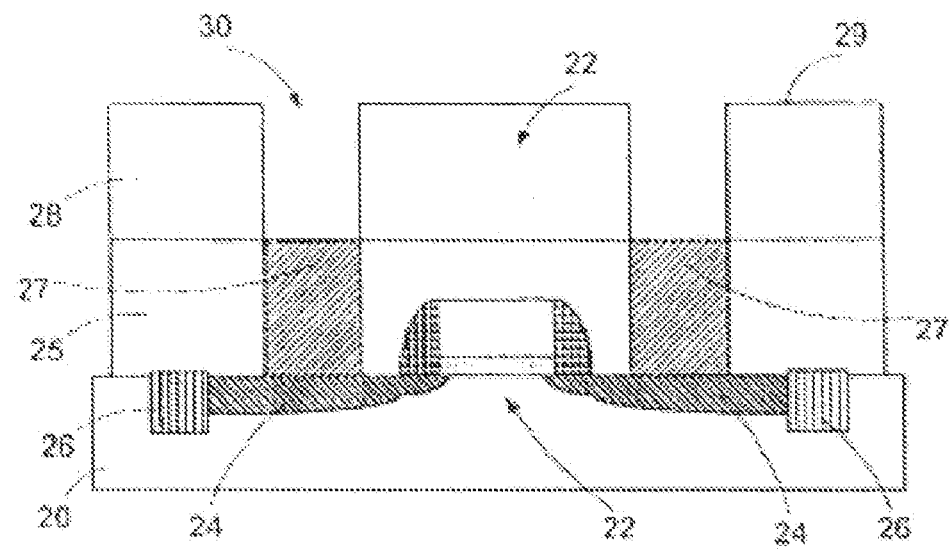
FIGS. 1-5 are cross sectional diagrams illustrating a prior art method of fabricating electronic memory devices.
Figure 2:
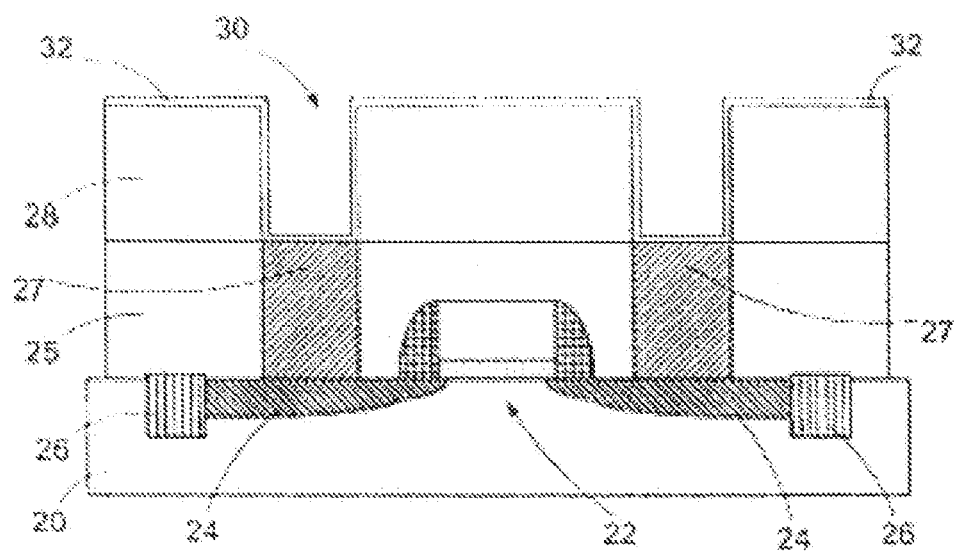
Figure 3:
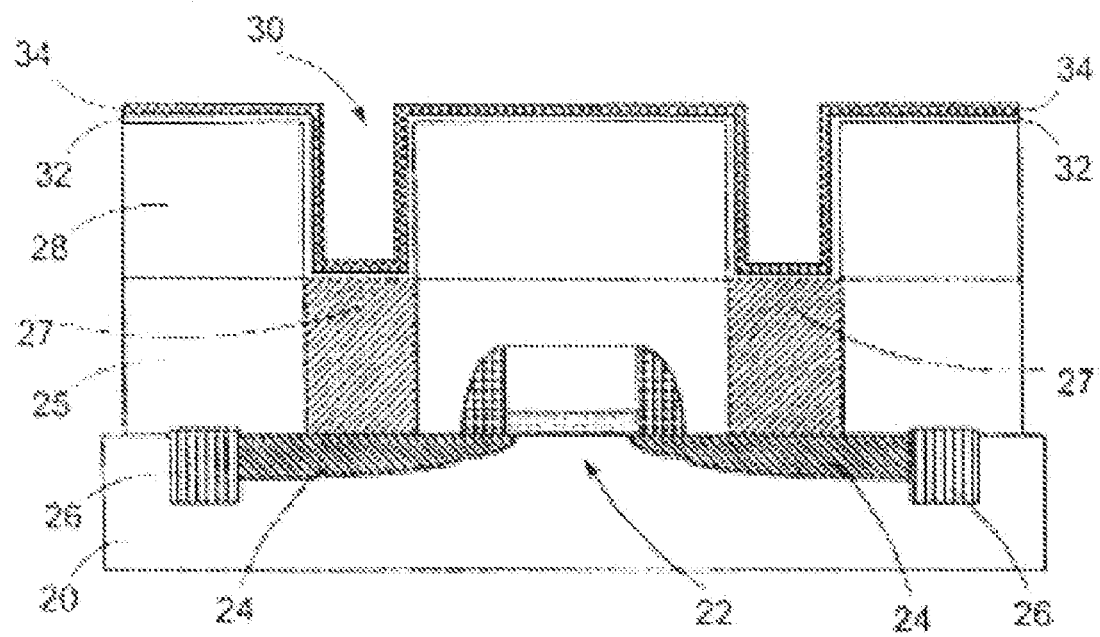
Figure 4:
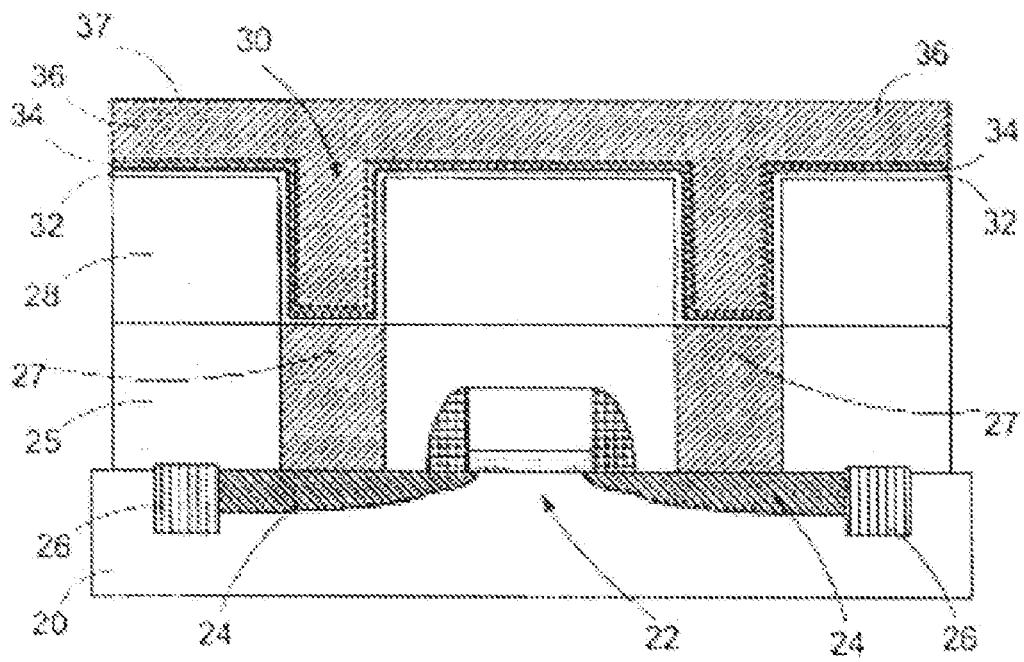
Figure 5:
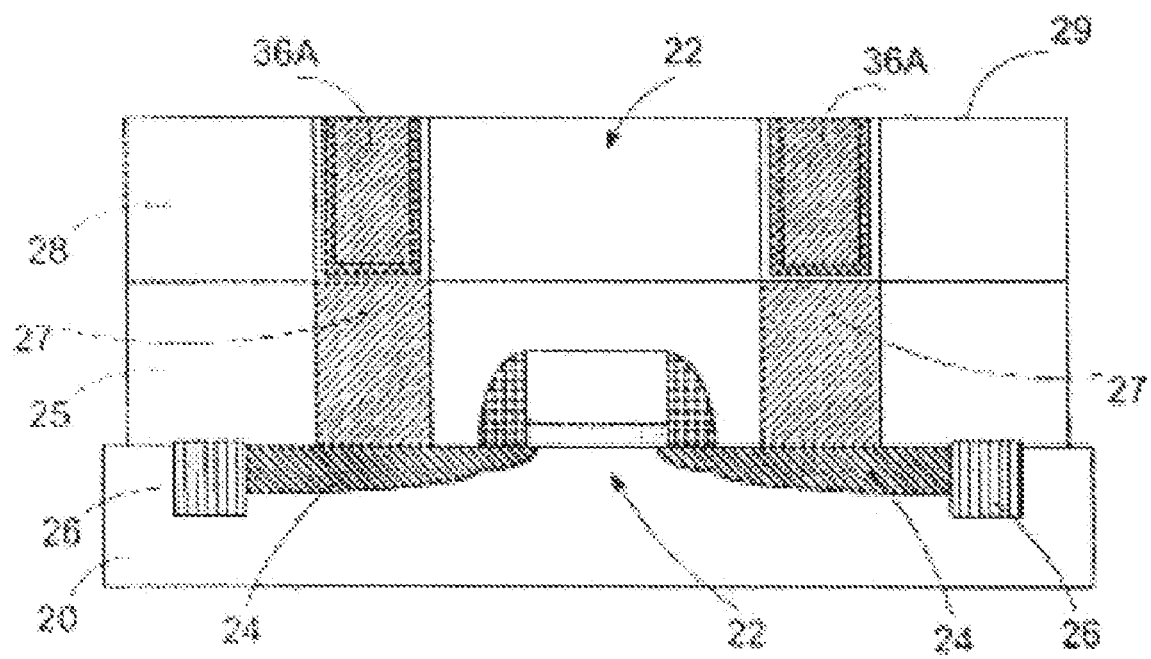

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

In accordance with the present invention, a method is provided for forming a dual damascene structure, for example, for an integrated circuit (IC) interconnect. In one aspect of the present invention, the method reduces the reliability issues described supra. These advantages are achieved by performing a low-H plasma treatment with a $N_2$ anneal and/or performing a low Si—H ESL SiN deposition, for example.

Figure 7A:
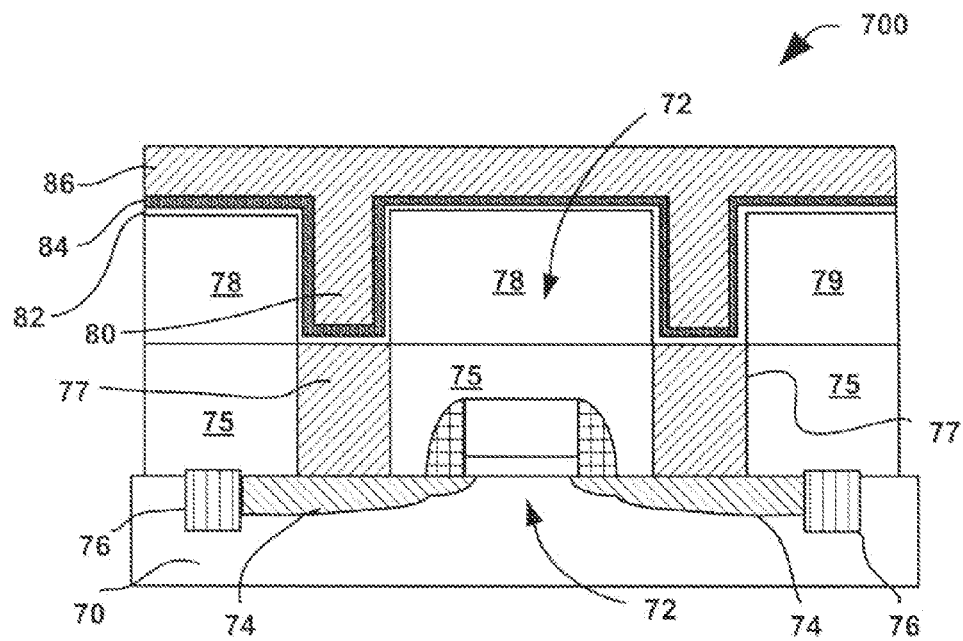
FIGS. 7A, 7B, 7C and 7D are cross section diagrams illustrating an apparatus formed according to at least one aspect of the present invention.
Figure 7B:
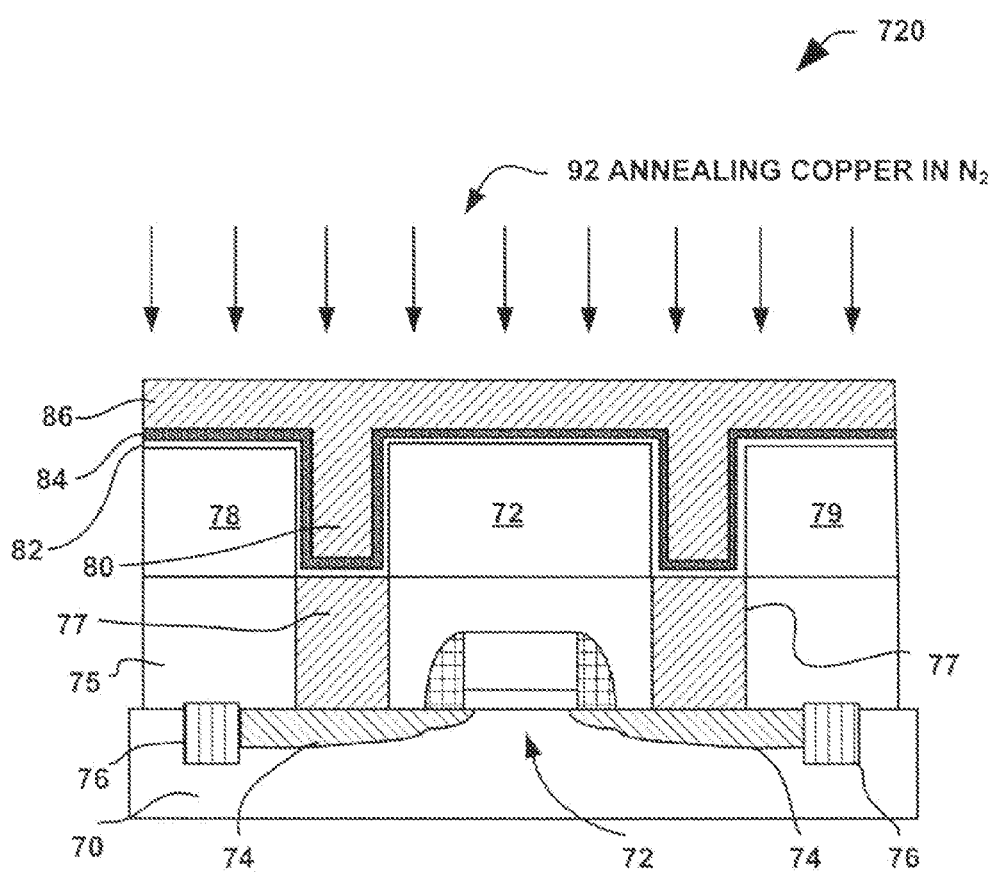
Figure 7C:
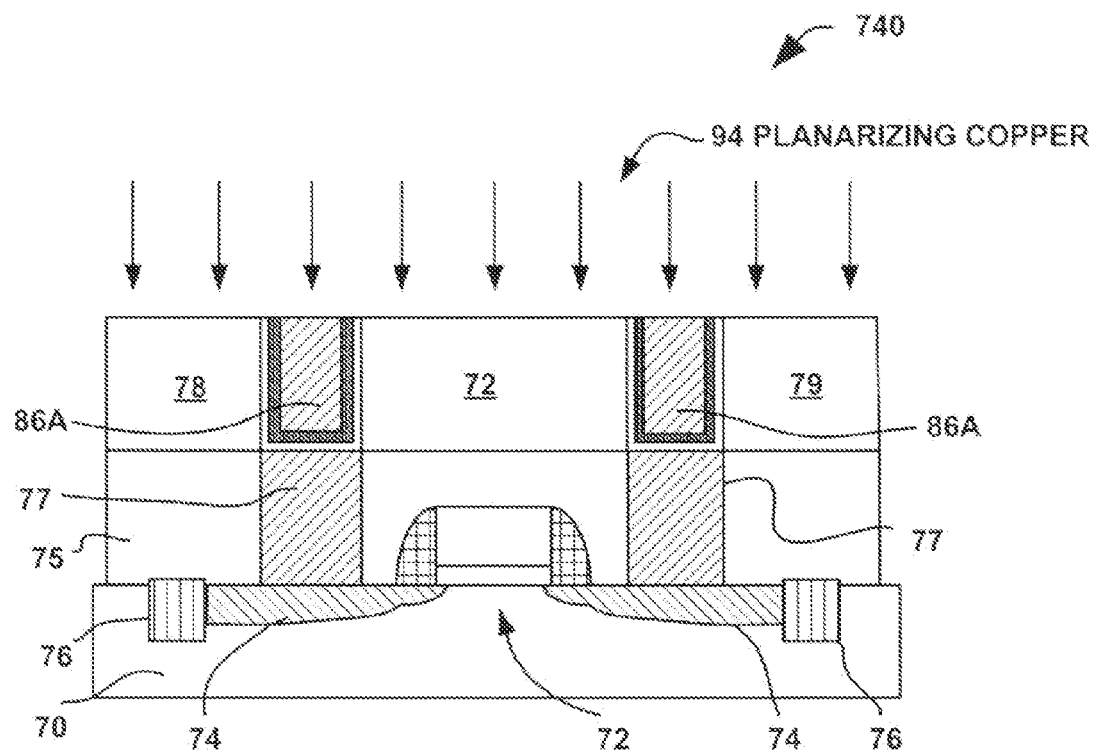
Figure 7D:
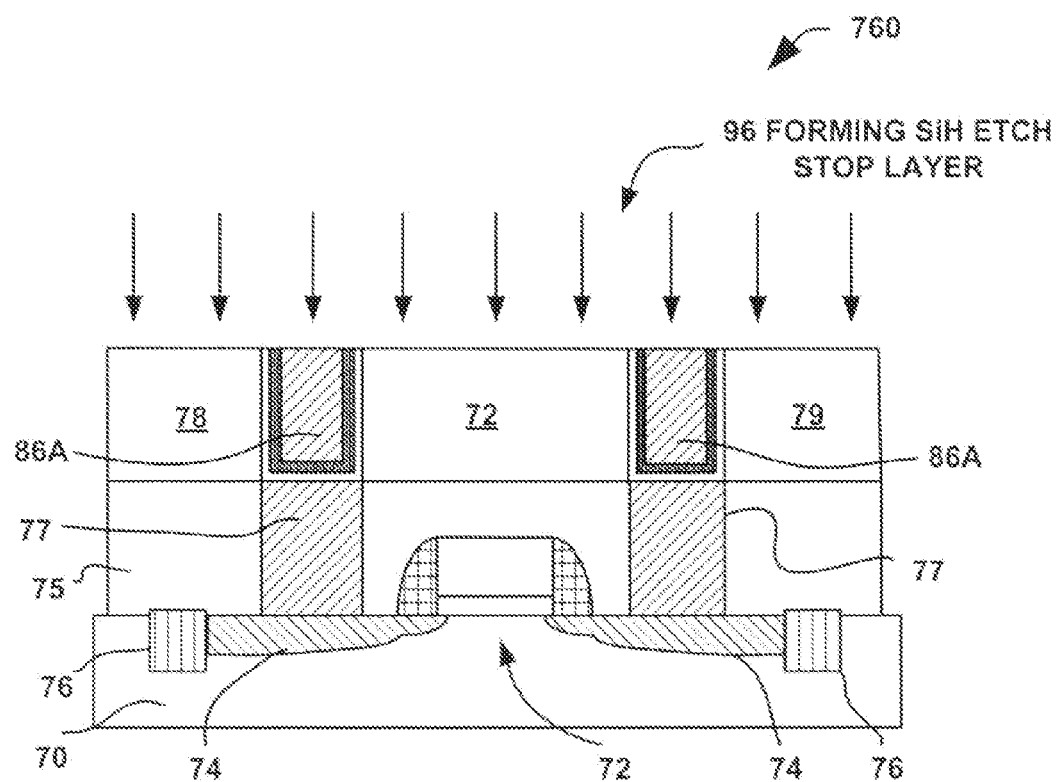
Figure 7E:
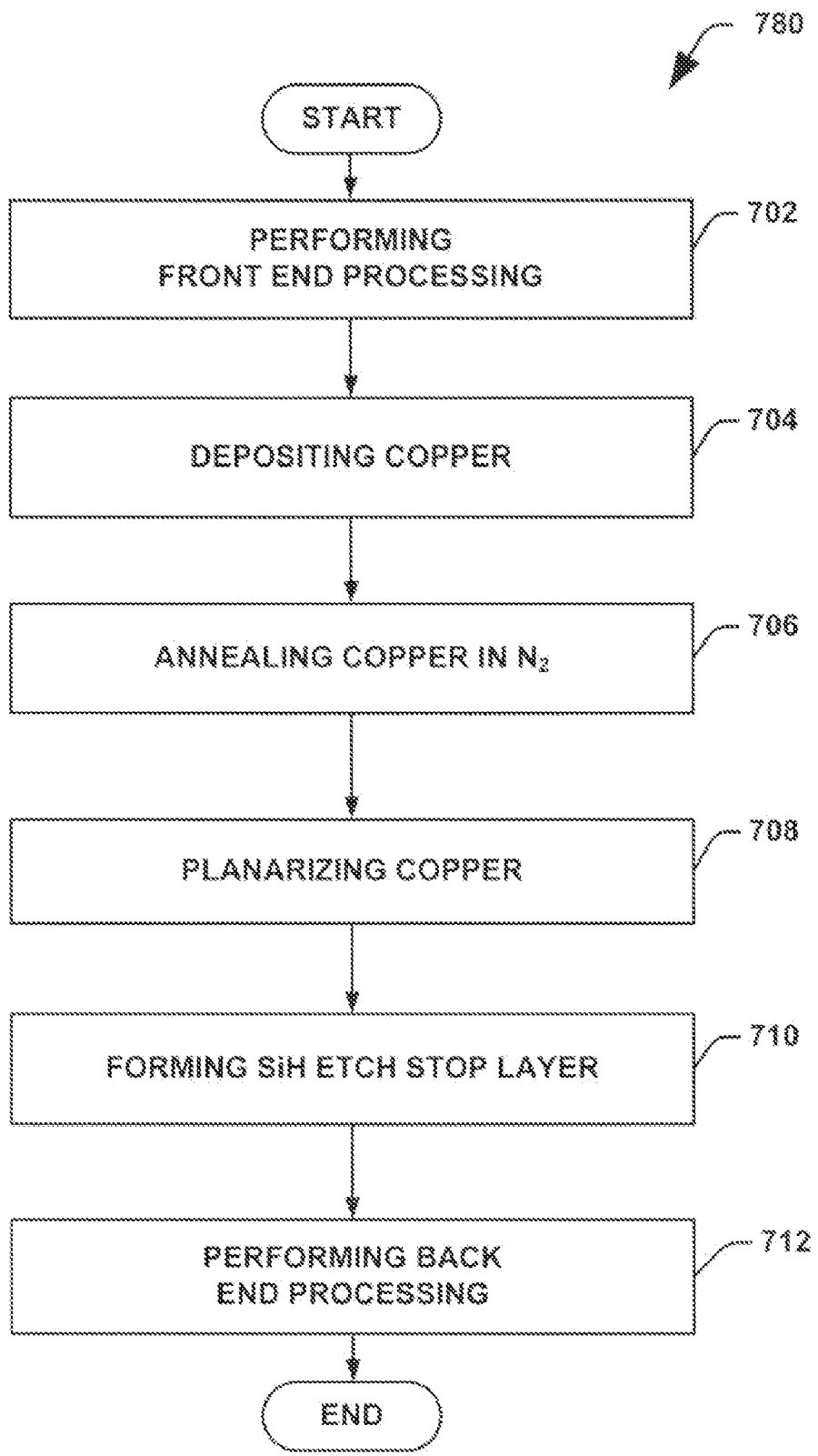
FIG. 7E is a flow chart diagram illustrating a method of forming a dual damascene structure according to at least one aspect of the present invention.

FIG. 7E represents a method 700 according to at least one aspect of the present invention that is similar in many respects to the method to create the device shown in prior art FIGS. 1-5, in terms of front end processing 702. FIG. 7E is described along with the electrical devices illustrated in FIGS. 7A, 7B, 7C and 7D. It is appreciated that the dual damascene structure can be formed using many different front-end-processing methods and all such methods are contemplated herein and are well known by those of skill in the art.

As shown in FIGS. 7E and 7A, during front end processing 702 a transistor 72 is formed on top of a substrate 70 between two isolation regions 76, as illustrated. The transistor 72 is comprised of source/drain regions 74 that are well known by those of skill in the art. Also depicted in 7A is a patterned layer of insulating material 75 having a plurality of conductive trenches or contacts 77 formed therein. As will be recognized by those skilled in the art, the conductive contacts 77 provide electrical contact to the source/drain regions 74 of the transistor 72. The materials used to form the components depicted in FIG. 7A, as well as the methods of making such components, are generally well-known to those skilled in the art and will not be described herein in any greater detail. For example, the conductive contacts 77 may be comprised of a variety of materials, e.g., tungsten, and they may be formed by a variety of known techniques. The size, shape and number of the conductive contacts 77 may also vary. Although not depicted in the drawings, a barrier/glue layer of metal, e.g., titanium may be formed in the openings in the patterned layer of insulating material 75 prior to forming the conductive contacts 77.

Those skilled in the art, after reading the entirety of the present application, will understand that the methods of the present invention may be employed to form conductive interconnections at any level of an integrated circuit device using a variety of techniques, such as single or dual damascene integration techniques.

Initially, a patterned layer of insulating material 78, having a plurality of openings 80 formed therein, is formed above the layer of insulating material 75 and the conductive contacts 77. The patterned layer of insulating material 80 may be comprised of a high-K (K>5) material, a low-K (2.5<K<5.0) material, or an ultra low-K (K<2.5) material, and it may be formed by a variety of processing methods, e.g., atomic layer deposition (ALD), chemical vapor deposition (CVD), spin-on dielectric (SOD), etc. Alternatively, a multi-film composite stack could be used which would include combinations of the above films and could include an etch stop layer, a middle etch stop, a cap layer, a pore seal layer, etc. The openings 80 in the patterned layer of insulating material 78 may be formed by performing one or more etching processes in an etch tool (not shown). Thereafter, the substrate 70, with the patterned layer of insulation material 78 formed thereabove, is positioned in the vacuum isolated tool where a degas process, an etch/clean process, a barrier metal deposition process, and a copper seed deposition process can be performed.

More specifically, the degas process is performed in a degas chamber, wherein the wafer 70 is heated under vacuum to a temperature range of approximately 150-450° C. for approximately 30-240 seconds. The purpose of the degas process is to remove, outgas or drive off a variety of residual materials that may be present on or in the patterned insulating material 28, such as water (as $H_2O$ or OH), CO, $CO_2$, $F_2$, hydrocarbons, etc. Then, the wafer 70 is vacuum-transferred to the etch/clean chamber 14, where any residual contamination, hydrocarbons, polymers or oxides covering any important contact regions are removed by sputter etching the wafer 70.

Once the wafer 70 has been cleaned in the etch/clean chamber, the wafer 70 is transferred under vacuum to a barrier metal deposition chamber, where a process is performed to deposit the barrier metal layer 82 shown in FIG. 7A. The barrier metal layer 82 is deposited above the patterned insulating layer 78 and in the openings 80 that were cleaned in the previous etch/clean chamber. The barrier metal layer 82 can be deposited by physical vapor deposition (PVD), chemical vapor deposition (CVD), atomic layer deposition (ALD) or other techniques known to those skilled in the art. This barrier metal layer 82 may be comprised of a variety of materials, e.g., tantalum, tantalum nitride, titanium, titanium nitride, titanium nitride silicon, titanium silicon nitride, tungsten, tungsten nitride, tungsten carbon nitride, etc., and it may have a thickness ranging from approximately 0.1-60 nm. The purpose of the barrier metal layer 82 is to, among other things, provide adhesion to the interlayer dielectric layers, provide wetting to the copper seed layer, and prevent migration of the copper material that forms the conductive interconnection 86A into unwanted areas of the integrated circuit device. Ideally, this barrier metal layer 82 will be as thin as possible, while still maintaining its ability to perform its intended function.

Next, the wafer 70 is sent, under vacuum, to a copper seed layer deposition chamber wherein the copper seed layer 84 is deposited above the barrier metal layer 82, as depicted in FIG. 7A. The process performed in the copper seed layer deposition chamber may be a PVD, CVD or ALD process, or any other technique known to those skilled in the art for forming such layers. The thickness of the copper seed layer 84 may range from approximately 20-200 nm. The copper seed layer 84 may be pure copper or it may be comprised of a copper alloy, such as copper tin, copper magnesium, copper chromium, copper calcium, etc. After the copper seed layer 84 is deposited, the wafer 70 may be removed from the barrier/seed tool and an electroplating process may be performed to form a bulk copper layer 86 above the wafer 70, as shown in FIG. 7A. The techniques and method used to form the bulk copper layer 86 using electroplating processes are well-known to those skilled in the art. After the bulk copper layer 86 is formed, an anneal process 92 may be performed in an $N_2$ environment (FIG. 7B), and one or more chemical mechanical polishing operations 94 may be performed. The CMP removes the excess portions of the bulk copper layer 86, the copper seed layer 84 (to the extent it is distinguishable from the bulk copper layer 86) and the barrier metal layer 82 from above the surface 79 of the patterned layer of insulating material 78 to thereby result in the definition of the copper interconnections 86A as shown in FIG. 7C.

The horizontal and vertical interconnects can then be filled with a conductive material such as copper, at 704. The copper has a lower resistivity than say aluminum (approximately 1.7 mW-cm compared to 3.1 mW-cm for aluminum). The copper can be deposited using chemical vapor deposition, physical vapor deposition, electroplating, and the like to form an interconnected conductive structure. The structure at 706 can be annealed 902 in a $N_2$ environment, for example, at a $N_2$ first flow rate of about 14,000 to 21,000 standard cubic centimeters (sccm). Once the structure has been filled with the copper (or another metal) and annealed 902, the surface can be planarized using chemical mechanical polishing (CMP) 94, as shown at 708.

At 710 an in-situ low H etch stop layer can be formed, for example. The RF power can be provided by a mixed frequency power source with a high frequency RF power at about 200 to 300 W and low frequency RF power at about 80 to 100 W. The pressure can be maintained at approximately about 1.8 to 2.8 Torr, for example. The method proceeds at 712 wherein back end processing is performed. Back end processing can comprise metallization, interconnect structure formation, copper line formation and wire bonding, for example, after which the process ends. It should be noted that the term "back end processing" is an arbitrary term that may include or exclude additional acts or processes.

Figure 6A:
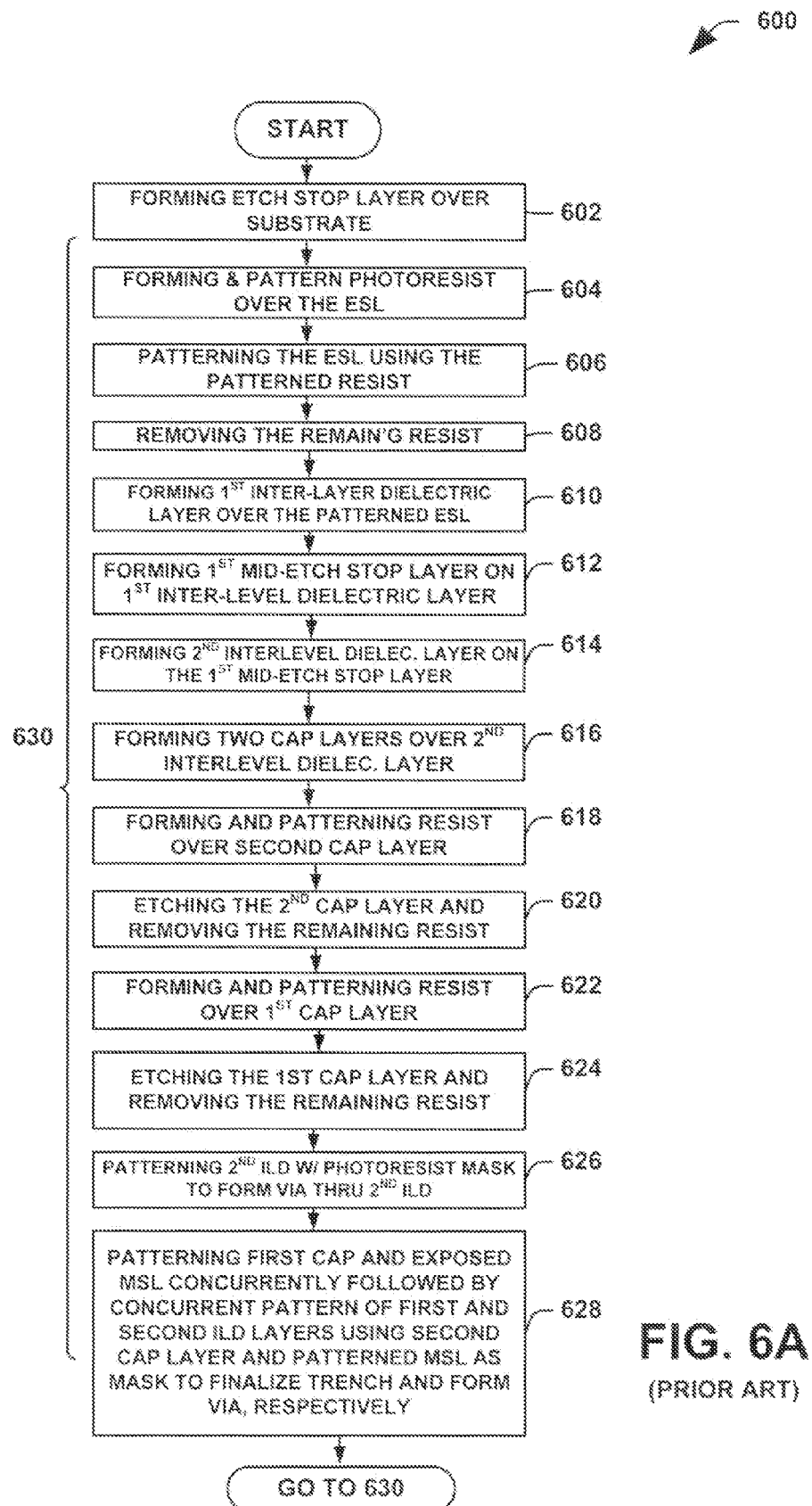
FIG. 6A is a prior art flow chart diagram illustrating a method of fabricating interconnects.
Figure 6B:
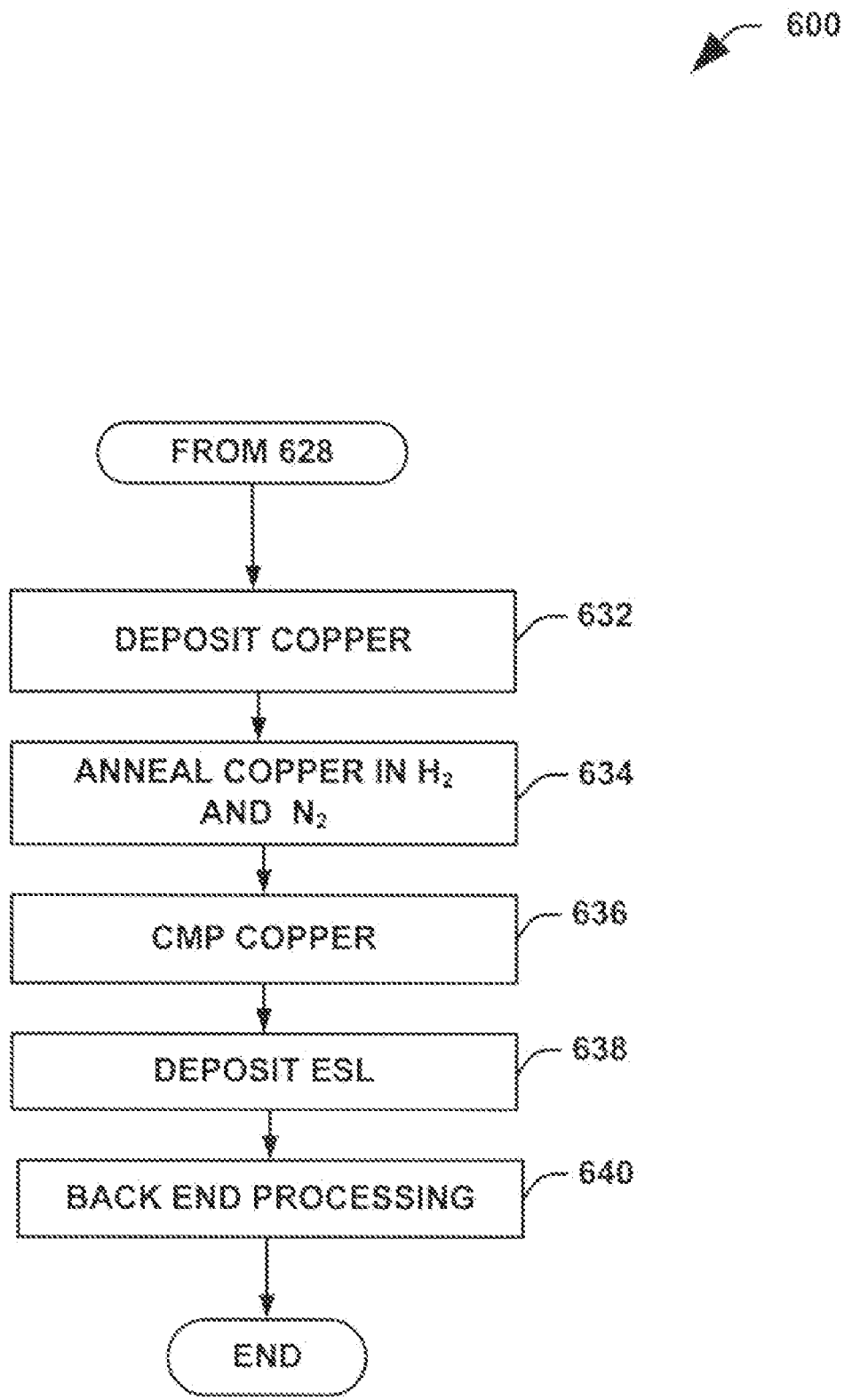
FIG. 6B is yet another prior art flow chart diagram illustrating a method of fabricating interconnects.
Figure 8:
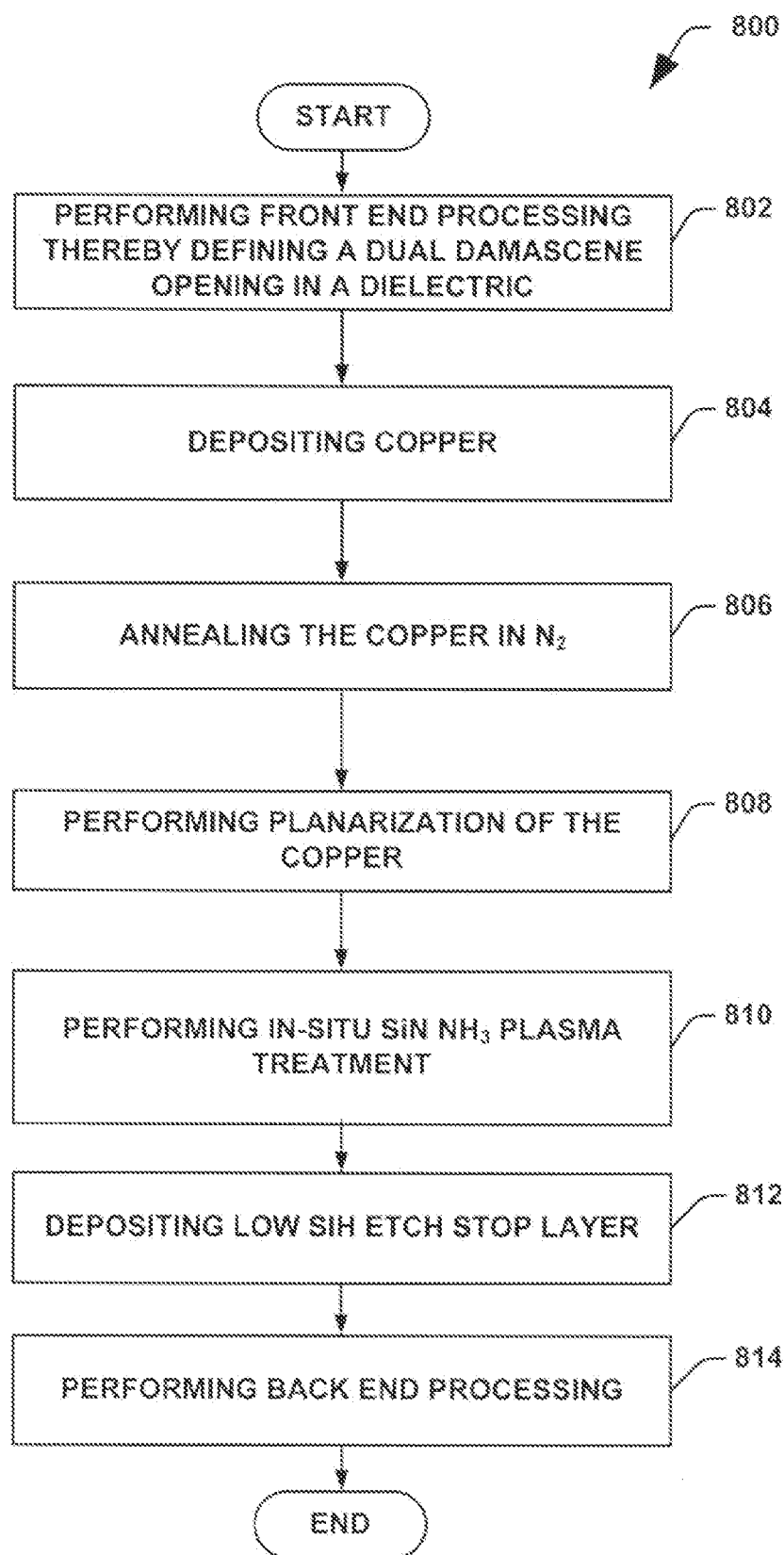
FIG. 8 is a flow chart diagram illustrating another method of forming a dual damascene structure according to at least one aspect of the present invention.

FIG. 8 represents yet another method 800, wherein the front-end-processing can be similar in many respects to the method 600 of FIG. 6A, in terms of front end processing 802. That is, the method 800 at 802 consists of front end processing similar to acts 602, 604, 606, 608, 610, 612, 614, 616, 618, 620, 622, 624, 626 and 628 referred to as 630 and these acts will not be repeated herein.

The horizontal and vertical interconnects can then be filled with a conductive material such as copper, at 804. The copper can be deposited using chemical vapor deposition, physical vapor deposition, electroplating, and the like to form an interconnected conductive structure. The structure at 806 can be annealed in a $N_2$ environment, for example, at a $N_2$ first flow rate of about 14,000 to 21,000 standard cubic centimeters (sccm). Once the structure has been filled with the copper (or another metal) and annealed, the surface can be planarized using chemical mechanical polishing (CMP), as shown at 808.

At 810 an in-situ SiN $NH_3$ plasma treatment can be performed. The $NH_3$ flowrate can be approximately 4,500 to 16,250 sccm at a temperature of approximately 400 C. The RF power can be provided by a mixed frequency power source with a high frequency RF power at about 200 to 300 W and low frequency RF power at about 80 to 100 W. The pressure can be maintained at approximately about 1.8 to 2.8 Torr, for example.

At 812 a low Si—H etch stop layer can be deposited. The ESL can be patterned at 812 via a dry etch process, for example, that is substantially selective to the underlying substrate material which can be, for example, copper or tungsten. The techniques of forming an etch stop layer are well known by those of ordinary skill in the art.

The method proceeds at 814 wherein back end processing is performed. Back end processing can comprise metallization, interconnect structure formation, copper line formation and wire bonding, for example, after which the process ends. It should be noted that the term "back end processing" is an arbitrary term that may include or exclude additional acts or processes.

Figure 9:
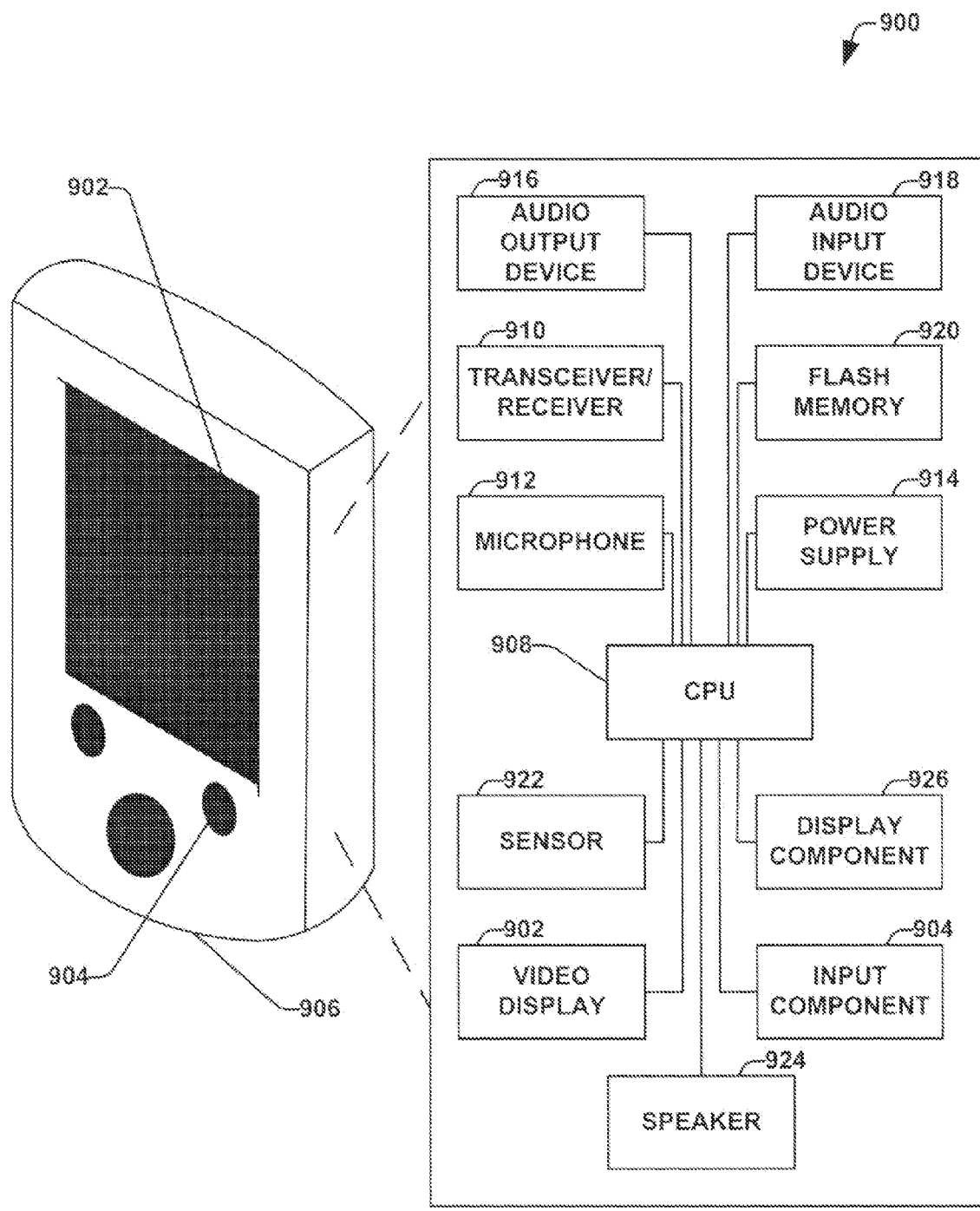
FIG. 9 is a schematic illustrating a method of forming a dual damascene structure according to an aspect of the present invention.

FIG. 9 is an exemplary portable electronic device, for example, a Personal Data Assistant (PDA) 900 comprising a video display 902, an input component 904, a housing 906, a CPU 908, a transceiver and/or a receiver 910, a microphone 912, a power supply 914, an audio output device 916, an audio input 918, flash memory 920, various sensors 922, and speaker(s) 924. The flash memory 920 manufactured using a dual damascene process utilizing in-situ low-H plasma treatment described supra, for example. The flash memory 920 can also be manufactured according to a low Si—H ESL SiN deposition described supra. The audio input device 918 can be a transducer, for example. The input component 904 can include a keypad, buttons, dials, pressure keys, and the like. The video display 902 can be a liquid crystal display, a plasma display, an LED display, and the like, for displaying visual data and information. In accordance with another embodiment of the claimed subject matter, the portable device with flash memory 920 manufactured according the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 920 can include random access memory, read only memory, optical memory, audio memory, magnetic memory, and the like.

According to one embodiment of the present invention, the CPU 908 is configured to communicate with the audio input device 918, the audio output device 916 and a display component 926. The display component 926 can be separate and distinct from the video display 902. The CPU 908 can execute control functions based on inputs from the user, entered using the input component 904, for example. Based on those inputs, for example the display component can display a graph, a photo, a map, a chart, a video, and the like. The PDA 900 is also configured to output data as an audio signal, for example a song, a message, a warning sound, various tones, recordings, etc.

In another embodiment of the present invention the PDA 900 can communicate with other electronic devices, for example computers, cell phones, other PDAs, and the like. The PDA 900 is also configured to transmit digital data wirelessly from one user to another. This is done utilizing the transmitter/receiver 910 to either transmit or receive data. Additionally, sensors 922 can be utilized to sense data external to the PDA 900, for example, temperatures, radiation levels, pressures, and the like. It will be further appreciated that any of the layers described herein can be formed in any one or more suitable manners, either alone or in combination, such as with spin-on techniques, sputtering techniques (e.g., magnetron or ion beam sputtering), growth and/or deposition techniques such as chemical vapor deposition (CVD) and/or low pressure chemical vapor deposition (LPCVD), for example.

Figure 10:
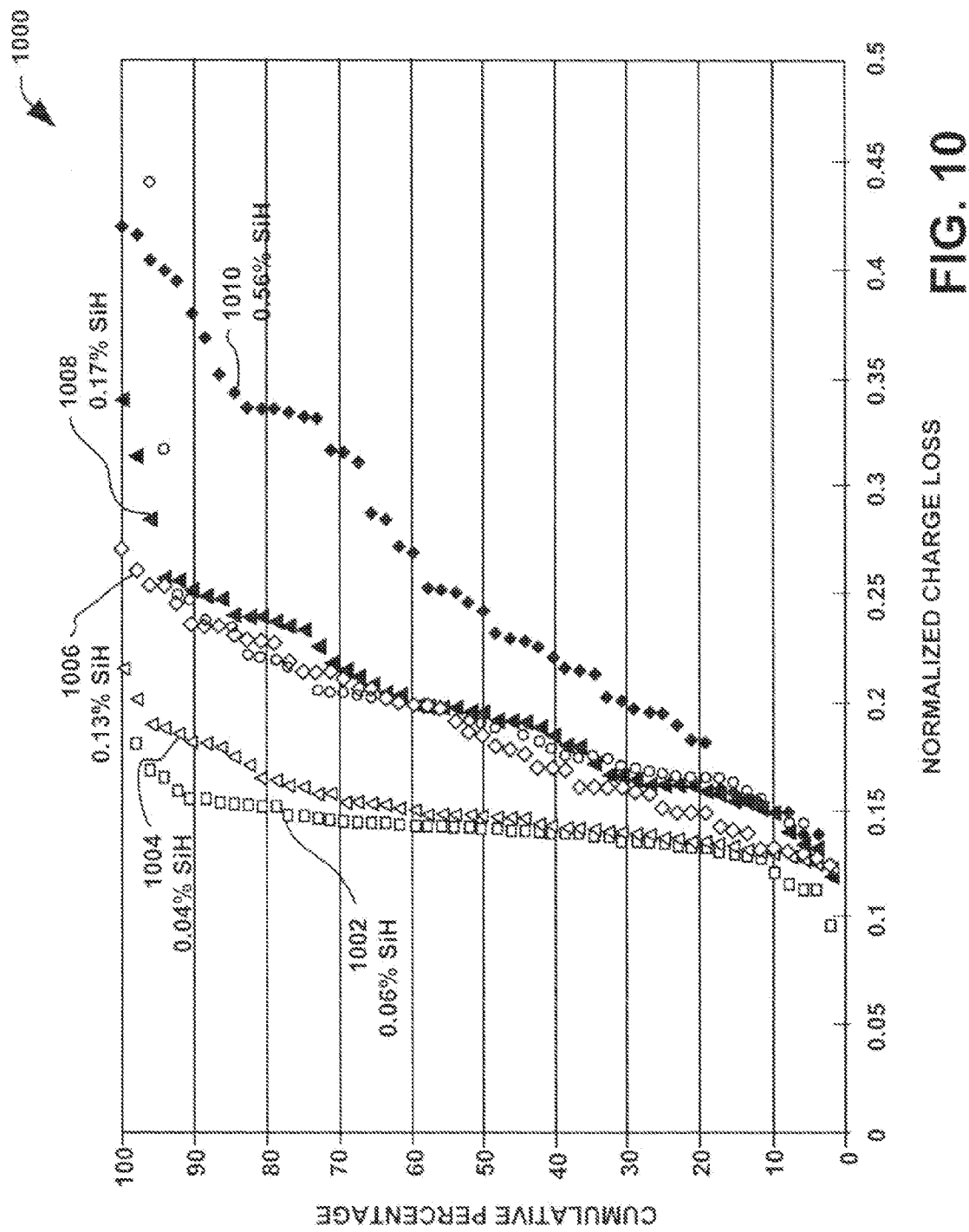
FIG. 10 is a graph illustrating the cumulative percentage of SiN vs. charge loss with a fixed percentage of Si—H according to an aspect of the invention.

Now referring to FIG. 10, illustrated is a chart showing various graphs of the cumulative percentage of SiN vs. normalized charge loss in a memory device for a given set percentage of Si—H. Graph 1002 (characterized by open rectangles), represents a relatively low 0.06% Si—H in SiN. As demonstrated, the normalized charge loss for the given memory device varies from approximately 0.1 to 0.18. Referring to FIG. 10, graph 1010 (represented by solid diamonds), in contrast represents a higher percentage if Si—H, 0.56% Si—H in SiN and the normalized charge loss is much higher ranging from approximately 0.14 to 0.42. As demonstrated, the lower percentages of Si—H in SiN correlate with less memory charge loss.

Figure 11:
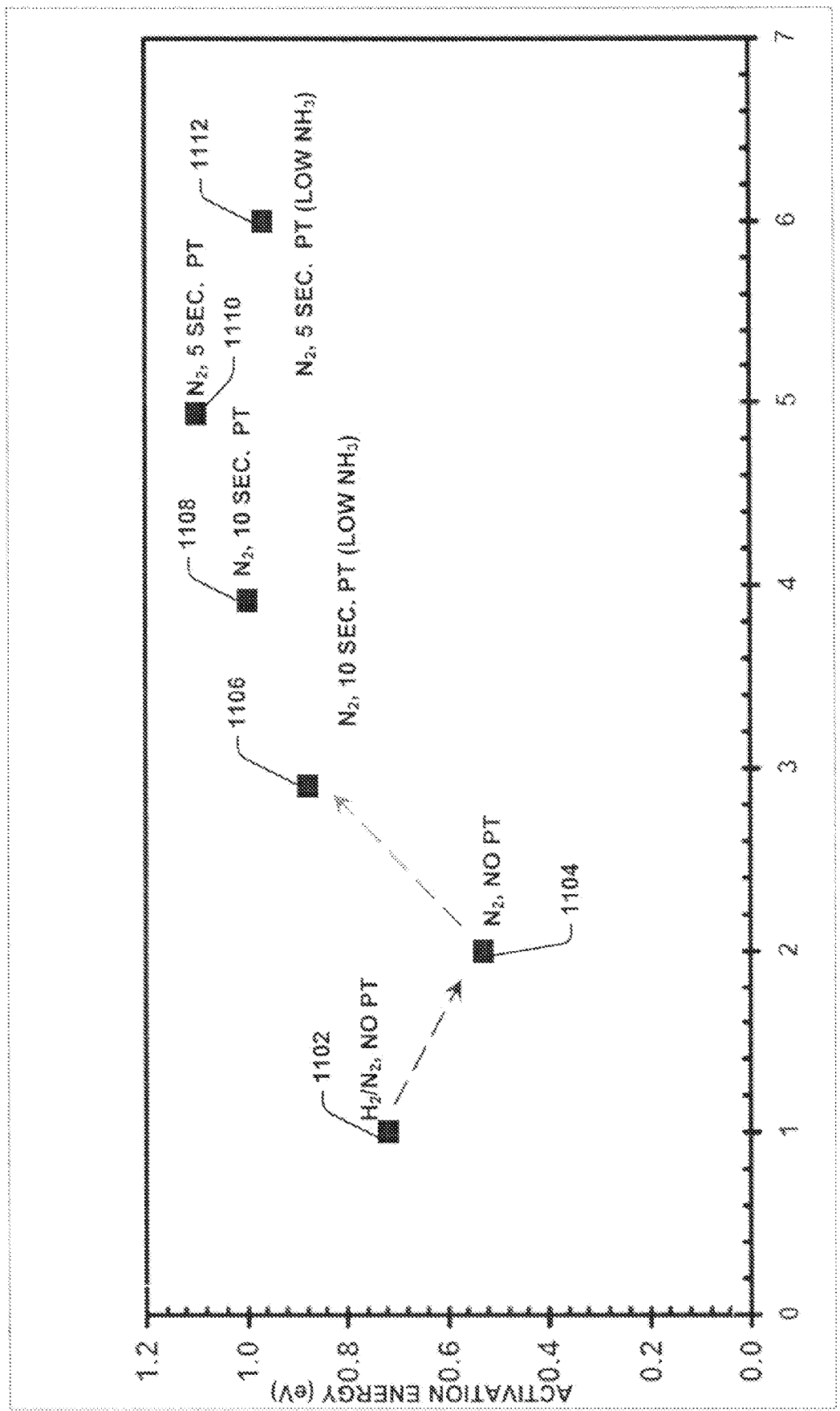
FIG. 11 is a graph illustrating activation energy according to yet another aspect of the invention.

Referring to FIG. 11, shown is a graph illustrating activation energy for various process conditions. FIG. 11 shows the relationship between EM, reliability activation energy Ea and anneal at ambient conditions ($N_2/H_2$ or $N_2$ only). In addition, in-situ plasma treatment (PT) conditions ($NH_3$ flow and treatment time) are illustrated. For the no PT conditions (data points 1102 and 1104), when an $N_2/H_2$ anneal was changed to an $N_2$ anneal (data point 1104) there was a charge loss improvement, however, Ea degraded and resulted in a worse EM performance. By including an in-situ PT (data points 1106, 1108 and 1110), Ea improved and also exceeded data point 1102 ($N_2/H_2$ anneal with no PT) but had a poor charge loss performance. An $N_2/H_2$ anneal with $NH_3$ PT process (not shown) had the worst charge loss result. Among the four data points (1106, 1108, 1110 and 1112), low $NH_3$ or low-H PT with shorter treatment times, data point 1112 exhibited the best charge loss performance.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

We claim:

1. A method for forming a single damascene and/or dual damascene contact and interconnect structure, comprising:
   forming a copper layer in an opening in an insulating layer overlying a semiconductor body;
   annealing the copper layer;
   performing planarization of the copper layer, thereby making a top surface of a resultant copper feature flush with a top surface of the insulating layer;
   performing an in-situ low-H $NH_3$ plasma treatment after the planarization of the copper layer;
   forming a low Si—H SiN etch stop layer over the copper feature and the insulating layer, wherein the SiN etch stop layer has a percentage of Si—H less than 0.20%.

2. The method of claim 1, wherein the annealing is performed at a temperature of between 40 and 480 degrees Celsius.

3. The method of claim 1, wherein RF power is provided during the formation of the low Si—H etch stop layer by a mixed frequency power source.

4. The method of claim 3, wherein the mixed frequency power source provides a high frequency RF power at between about 20 and 2000 W and a low frequency RF power at between about 10 and 1000 W.

5. The method of claim 1, wherein annealing the copper layer comprises annealing with $N_2$ provided at a flow rate of between 100 and 100,000 sccm.

6. The method of claim 1, wherein annealing the copper layer comprises performing the anneal with at least 99.9% $N_2$ with less than 0.1% $H_2$.

7. The method of claim 1, wherein annealing the copper layer comprises performing the anneal in at least 90% $N_2$ with less than 10% $H_2$.

8. The method of claim 1, wherein a time for the low-H $NH_3$ plasma treatment is about 4 to 6 seconds.

9. The method of claim 1, wherein a time for the low-H $NH_3$ plasma treatment is less than 10 seconds.

* * * * *